(12) United States Patent
Shih

(10) Patent No.: US 8,436,452 B2
(45) Date of Patent: May 7, 2013

(54) CARRIER FOR CHIP PACKAGES

(75) Inventor: Pai-Sheng Shih, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 374 days.

(21) Appl. No.: 12/790,261

(22) Filed: May 28, 2010

(65) Prior Publication Data

US 2011/0291255 A1    Dec. 1, 2011

(51) Int. Cl.
*H01L 23/02* (2006.01)
*B65D 85/00* (2006.01)

(52) U.S. Cl.
USPC ........... 257/678; 257/680; 206/561; 206/562; 206/701

(58) Field of Classification Search ................... 257/680; 206/701, 561, 562
See application file for complete search history.

(56) References Cited

U.S. PATENT DOCUMENTS

| | | | |
|---|---|---|---|
| 6,653,728 B1 * | 11/2003 | Jhong et al. | 257/697 |
| 7,274,107 B2 | 9/2007 | Hedler et al. | |
| 2004/0021477 A1 * | 2/2004 | Tay et al. | 324/755 |
| 2006/0163727 A1 * | 7/2006 | Hedler et al. | 257/738 |

FOREIGN PATENT DOCUMENTS

CN   1501466 A   6/2004

* cited by examiner

*Primary Examiner* — Michael Lebentritt
*Assistant Examiner* — Aaron Dehne

(57) ABSTRACT

A carrier for holding a plurality of chip packages and a carrier assembly are provided, wherein the chip package has a central area without solder balls and a peripheral area with solder balls formed thereon. The carrier includes a tray component and a plurality of supports disposed on the tray component, wherein each support holds the central area of a respective chip package. The carrier assembly is formed by stacking a plurality of the carriers through a plurality of peripheral projections disposed at a periphery of each tray component, wherein each peripheral projection has a pin formed thereon and a hole formed thereunder.

18 Claims, 11 Drawing Sheets

CARRIER FOR CHIP PACKAGES

BACKGROUND OF THE INVENTION

1. Field of the Invention

The present invention relates to a carrier, and in particular relates to a carrier for holding chip packages.

2. Description of the Related Art

Generally, chip packages are placed in a carrier for transporting and processing the chip packages during manufacturing and testing operations. The carrier can hold the chip packages and prevent the chip packages from damage. Referring to FIG. 1, a conventional carrier for holding the chip package is shown. A chip package 10 is placed in a carrier 40. The carrier 40 includes a cover component 20 and a tray component 30. The tray component 30 has step-shaped parts 22 to contact with a bottom side of a chip 12 for supporting the chip package 10 on the tray component 30 and then the cover component 20 is placed to cover the tray component 30.

Recently, chips are being packaged using a window ball grid array (wBGA) type chip package. As shown in FIG. 1, the chip 12 is packaged to form a wBGA type chip package 10, wherein a window 14 is formed on the central area of the chip 12 and solder balls 16 are formed at the periphery of the window 14. However, the amount of solder balls for a wBGA type chip package has increased with the development of chip packages for new generation products. Therefore, the space between the outside solder balls and the outside of the chip has been reduced so that it is easier for the outside solder balls to be damaged by the tray component 30. Damaged solder balls decreases chip package yield.

Thus, a carrier for holding chip packages which can overcome the above problems to prevent the solder balls from damage is therefore desired.

BRIEF SUMMARY OF THE INVENTION

According to an illustrative embodiment, a carrier for holding a plurality of chip packages is provided, wherein the chip package has a central area without solder balls and a peripheral area with solder balls thereon. The carrier comprises a tray component and a plurality of supports disposed on the tray component, wherein each support holds the central area of a respective chip package.

According to another illustrative embodiment, a carrier for holding a plurality of chip packages is provided, wherein the chip package has a central area without solder balls and a peripheral area with solder balls thereon, and a window is formed on the central area of the chip package. The carrier comprises a tray component and a plurality of peripheral projections disposed at a periphery of the tray component. Then, a plurality of supports is disposed on the tray component, wherein each support holds the central area of a respective chip package and each support has a trench recess formed thereon, corresponding to the central area of the chip packages.

According to an illustrative embodiment, a carrier assembly for holding a plurality of chip packages is provided. The carrier assembly comprises a plurality of the carriers. A plurality of peripheral projections is disposed at a periphery of each tray component, wherein each peripheral projection has a pin formed on a top of the peripheral projection and a hole formed on a bottom of the peripheral projection. The carriers are stacked together by putting the pins of the peripheral projections of a lower tray component in the holes of the peripheral projections of an upper tray component.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of a carrier and a carrier assembly of the invention for holding chip packages are illustrated by embodiments used for window ball grid array (wBGA) type chip packages in the following description and the accompanying drawings. However, it should be appreciated that the carrier and the carrier assembly of the invention may also be applied to other types of chip packages. Moreover, for the purpose of clarity of illustration, only one chip package is shown in each carrier of FIGS. 2-7. However, it should be appreciated that the carrier and the carrier assembly of the invention are used for holding a plurality of chip packages.

Figure 1:
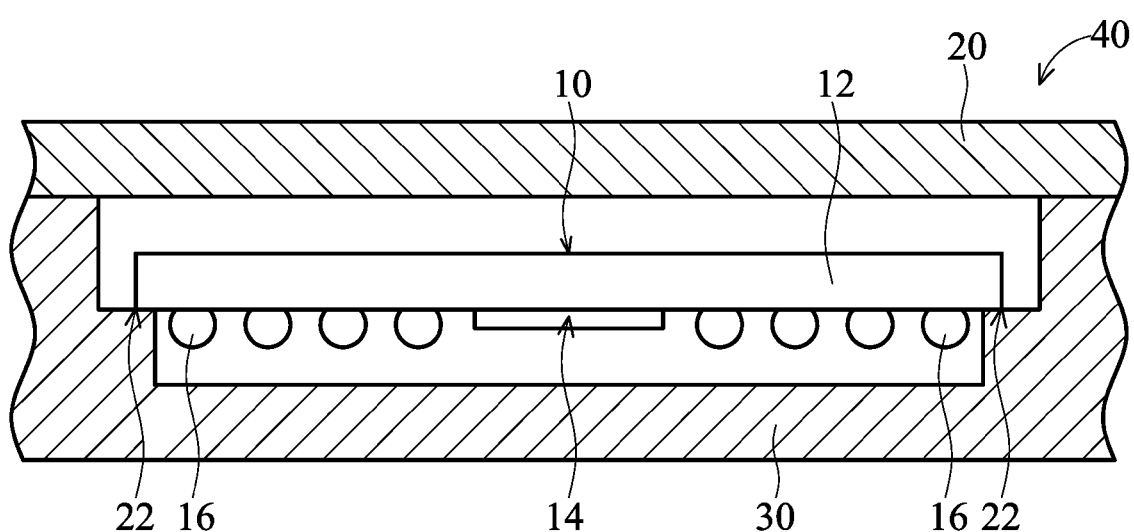
FIG. 1 shows an illustrative cross section of a chip package in a conventional carrier.
Figure 2A:
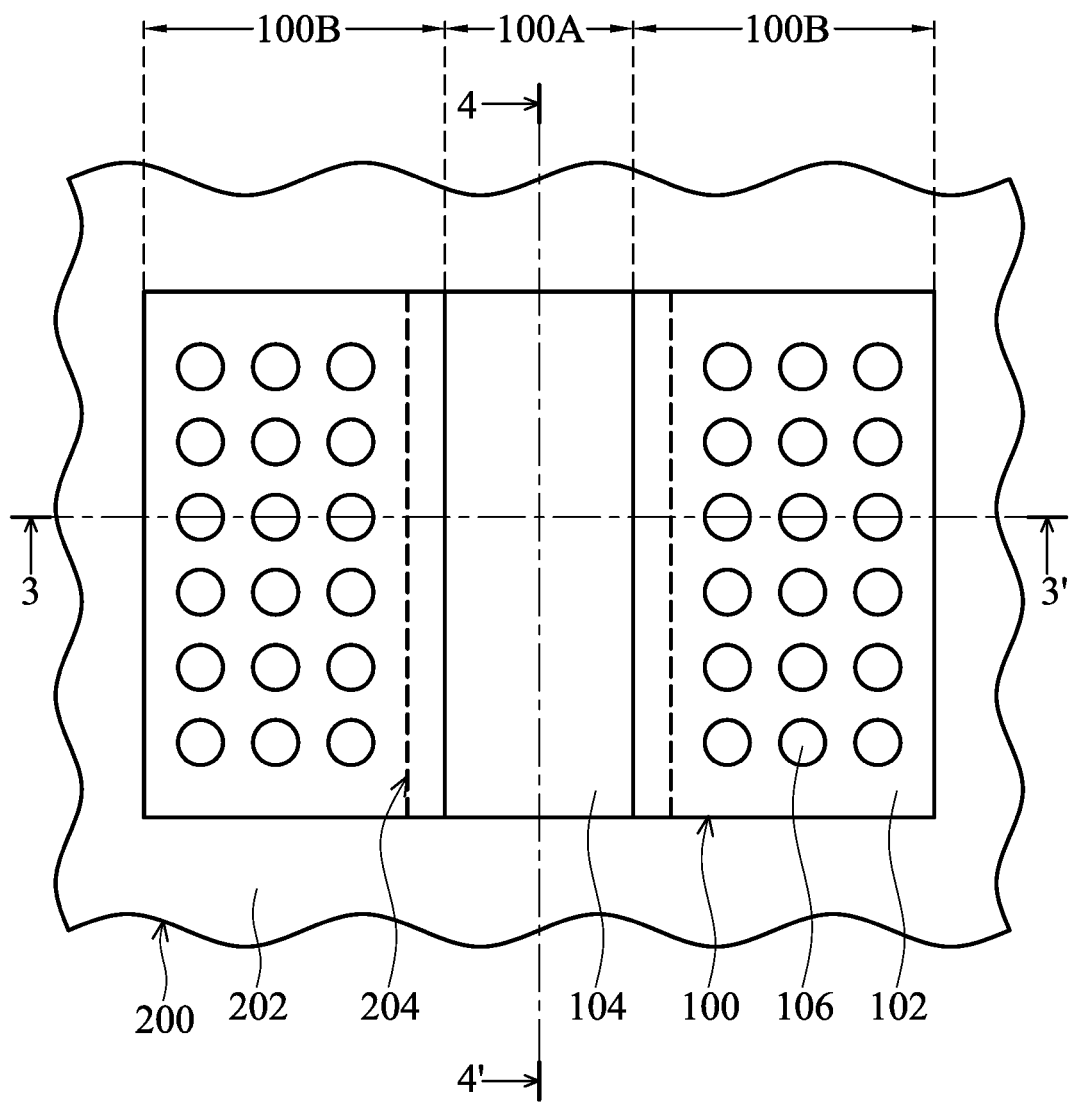
FIG. 2A shows an illustrative plane view of a chip package held by a carrier according to an embodiment of the invention.

Referring to FIG. 2A, an illustrative plane view of a chip package 100 in a carrier 200 according to an embodiment of the invention is shown. In an embodiment, the chip package 100 may be a wBGA type chip package. The wBGA type chip package 100 has a central area 100A without solder balls and a peripheral area 100B with solder balls 106 formed thereon. In addition, a window 104 is formed on the central area 100A of the chip package 100. The surface of a wBGA type chip package 100 having the window 104 and the solder balls 106 formed thereon is an active surface of a chip 102. The active surface of the chip 102 has a plurality of conductive pads (not shown) formed thereon. Conductive pads are electrically connected to the solder balls 106 through conductive wires (not shown), and then conductive pads and conductive wires are covered with a mold compound to form the window 104.

A carrier 200 is disposed under the chip package 100 for holding the chip package 100. The carrier 200 has a tray component 202 and a plurality of supports 204 formed on the tray component 202. The supports 204 project from the tray component 202 and each support 204 holds the central area 100A of a respective chip package 100.

Figure 3A:
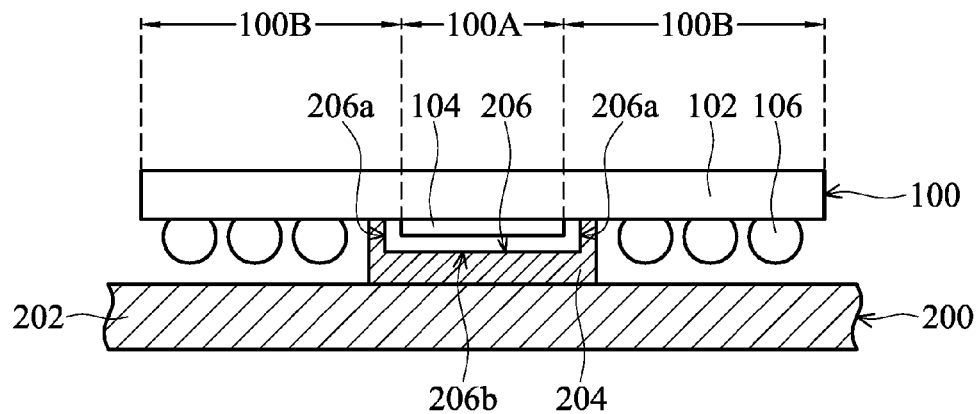
FIGS. 3A-3D show illustrative cross sections of a chip package held by a carrier along a cross section line 3-3' of FIG. 2A or FIG. 2B according to various embodiments of the invention.
Figure 3B:
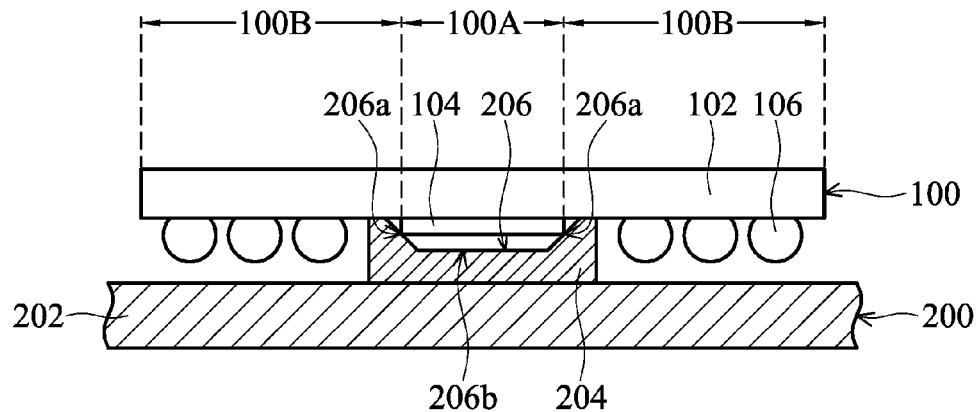
Figure 3C:
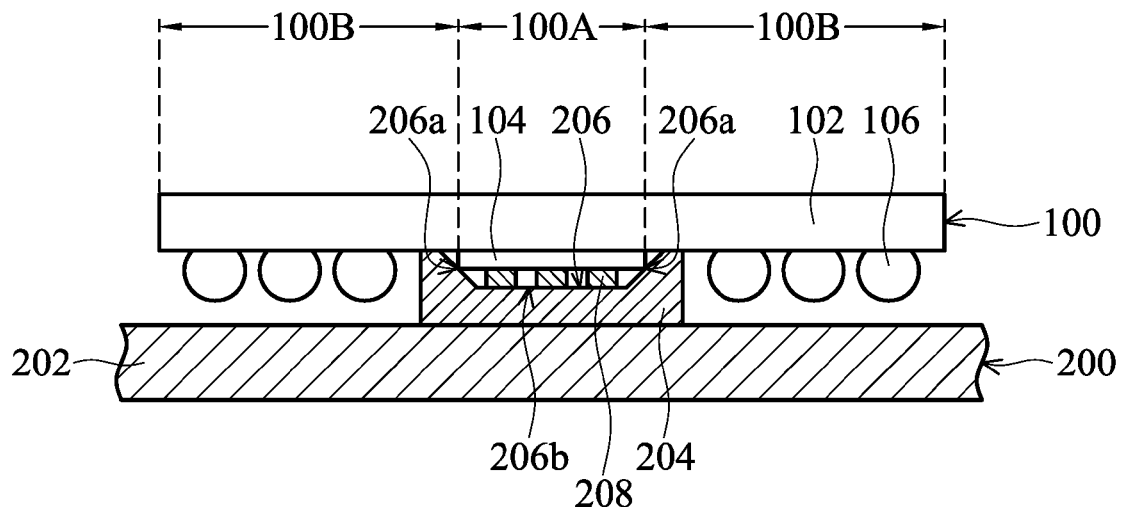

Then, referring to FIGS. 3A-3C, illustrative cross sections of the chip package 100 held by the carrier 200 along a cross section line 3-3' of FIG. 2A according to various embodiments of the invention are shown. As shown in FIG. 3A, each support 204 has a trench recess 206 formed thereon, corresponding to the central area 100A of the chip package 100. In the embodiment, the trench recess 206 has two sidewalls 206a and a bottom side 206b, wherein the two sidewalls 206a are formed along the same direction as the direction of a cross section line 4-4' of FIG. 2A and the two sidewalls 206a are vertical to the bottom side 206b. Note that the window 104 of the chip package 100 is placed in the trench recess 206 of the support 204 and the solder balls 106 are spaced apart form the tray component 202. Therefore, the carrier 200 can hold the chip packages 100 for transporting and processing the chip packages 100 during manufacturing and testing operations and prevent the chip packages 100 from damage when the carrier 200 is moved. Moreover, the central area 100A of the chip package 100 is held by the support 204 of the carrier 200 and the outside solder balls 106 are not in contact with the carrier 200. Therefore, the space between the outside solder balls 106 and the outside of the chip 102 can be reduced to satisfy the requirement for increasing the amount of solder balls for chip packages for new generation electronic products.

Next, as shown in FIG. 3B, each support 204 has a trench recess 206 formed thereon, corresponding to the central area 100A of the chip package 100. In the embodiment, the trench recess 206 has two sidewalls 206a and a bottom side 206b, wherein the two sidewalls 206a are formed along the same direction as the direction of a cross section line 4-4' of FIG. 2A and the two sidewalls 206a are inclined to the bottom side 206b. The window 104 of the chip package 100 is placed in the trench recess 206 of the support 204 and the solder balls 106 are spaced apart form the tray component 202. Note that the inclined sidewalls 206a of the trench recess 206 can help the window 104 of the chip package 100 to be easily placed in the trench recess 206 of the support 204. Moreover, the inclined sidewalls 206a of the trench recess 206 can clamp onto the window 104 of the chip package 100 and help to fix the chip package 100 in the carrier 200.

Next, as shown in FIG. 3C, each support 204 has a trench recess 206 formed thereon, corresponding to the central area 100A of the chip package 100. In the embodiment, the trench recess 206 has two sidewalls 206a and a bottom side 206b, wherein the two sidewalls 206a are formed along the same direction as the direction of a cross section line 4-4' of FIG. 2A and the two sidewalls 206a are inclined to the bottom side 206b. Moreover, the support 204 further includes one or more than one projections 208 formed in the trench recess 206. In the embodiment, the projection 208 can help to support the chip package 100.

Figure 4:
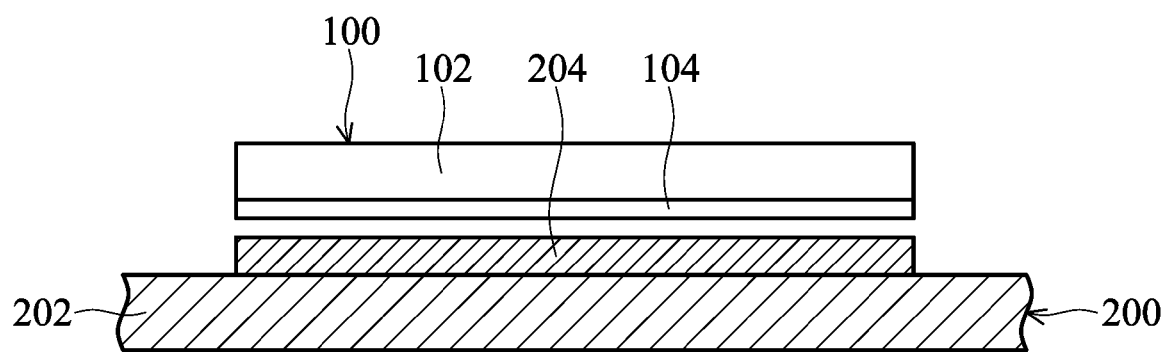
FIG. 4 shows an illustrative cross section of a chip package held by a carrier along a cross section line 4-4' of FIG. 2A according to an embodiment of the invention.

Then, referring to FIG. 4, an illustrative cross section of the chip package 100 held by the carrier 200 along a cross section line 4-4' of FIG. 2A according to an embodiment of the invention is shown. As shown in FIG. 4 and any one of FIGS. 3A-3C, in an embodiment of the carrier 200, the trench recess 206 of the support 204 has two sidewalls 206a vertical or inclined to the bottom side 206b. The window 104 of the chip package 100 is placed in the trench recess 206 of the support 204 on the tray component 202. Further, the window 104 of the chip package 100 may be clamped by the inclined sidewalls 206a of the trench recess 206 of the support 204.

Figure 2B:
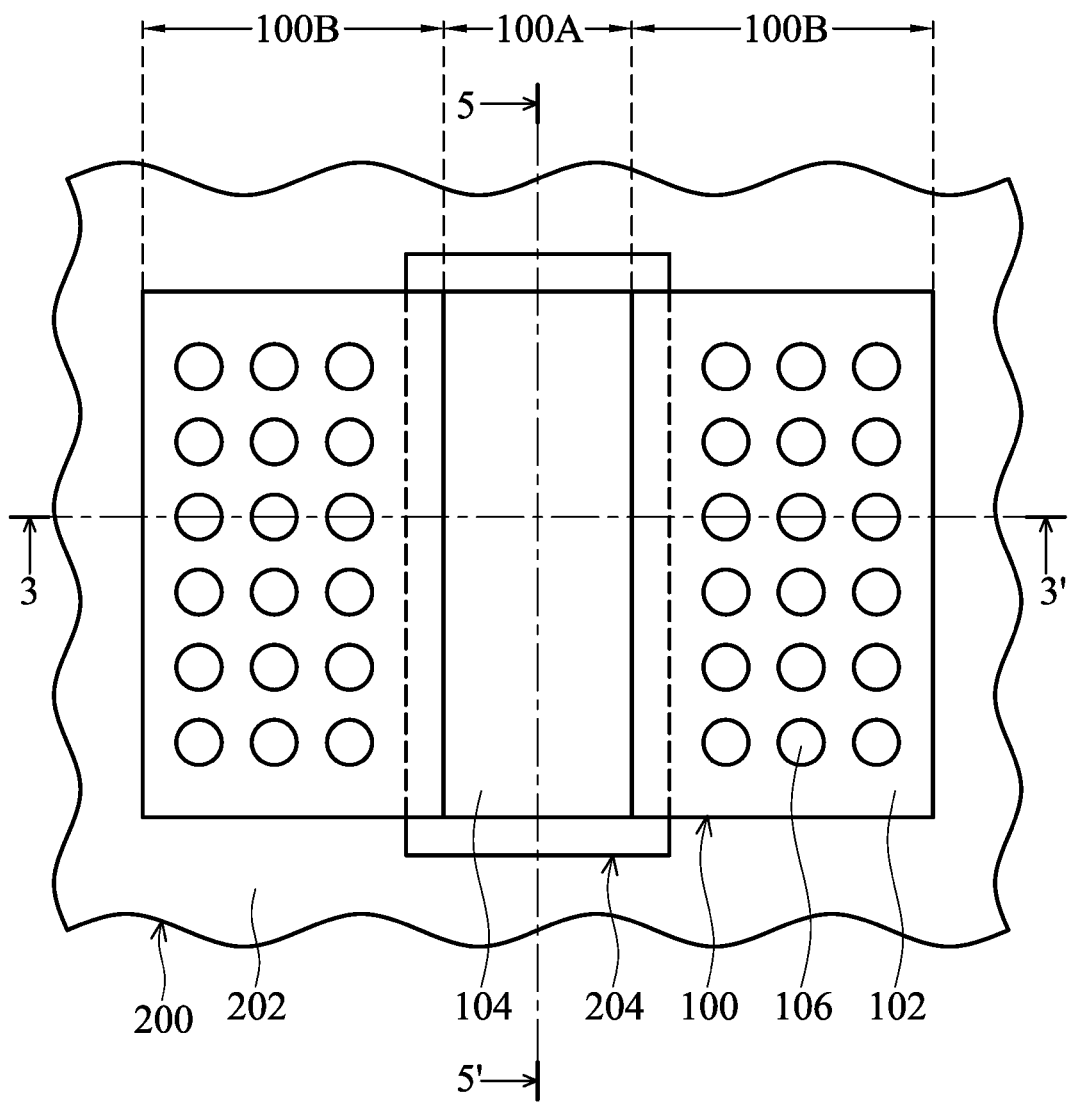
FIG. 2B shows an illustrative plane view of a chip package held by a carrier according to an embodiment of the invention.

Referring to FIG. 2B, an illustrative plane view of a chip package 100 in a carrier 200 according to an embodiment of the invention is shown. In an embodiment, the chip package 100 may be a wBGA type chip package. The wBGA type chip package 100 has a central area 100A without solder balls and a peripheral area 100B with solder balls 106 thereon. In addition, a window 104 is formed on the central area 100A of the chip package 100. A carrier 200 is disposed under the chip package 100 for holding the chip package 100. The carrier 200 has a tray component 202 and a plurality of supports 204 formed on the tray component 202. The supports 204 project from the tray component 202 and each support 204 holds the central area 100A of a respective chip package 100.

Figure 5A:
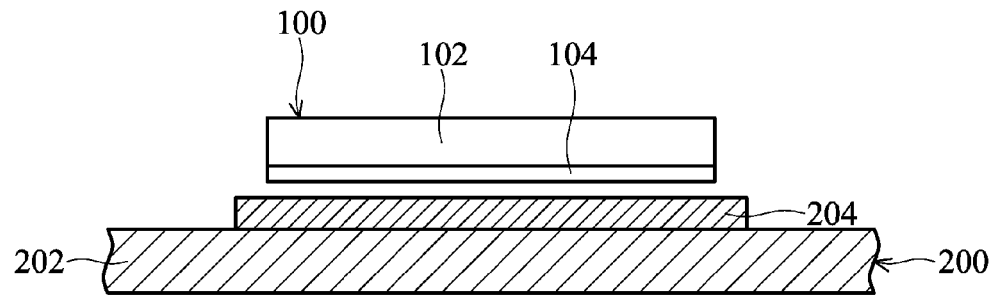
FIGS. 5A-5D show illustrative cross sections of a chip package held by a carrier along a cross section line 5-5' of FIG. 2B or FIG. 2C according to various embodiments of the invention.

Then, referring to FIGS. 3A-3D, illustrative cross sections of the chip package 100 held by the carrier 200 along a cross section line 3-3' of FIG. 2B according to various embodiments of the invention are shown. FIGS. 3A-3C are illustrated as the described above, and are not repeated again for simplification. As shown in FIGS. 3A-3C, along the direction of the cross section line 3-3' of FIG. 2B, the support 204 on the tray component 202 has a trench recess 206 formed thereon. Thus, the window 104 of the chip package 100 can be placed in the trench recess 206 of the support 204. Accordingly, to correspond with the embodiments of the carriers 200 as shown in FIGS. 3A-3C, a cross section of the embodiments of the carriers 200 along a cross section line 5-5' of FIG. 2B can be similar to any one of the embodiments of the carriers 200 as shown in FIGS. 5A-5D. Referring to FIGS. 5A-5D, illustrative cross sections of the chip package 100 held by the carrier 200 along the cross section line 5-5' of FIG. 2B according to various embodiments of the invention are shown. As shown in FIG. 5A, along the direction of the cross section line 3-3' of FIG. 2B, the support 204 has no sidewall. The window 104 of the chip package 100 is placed in the trench recess 206 of the support 204 as shown in FIGS. 3A-3C.

Figure 5B:
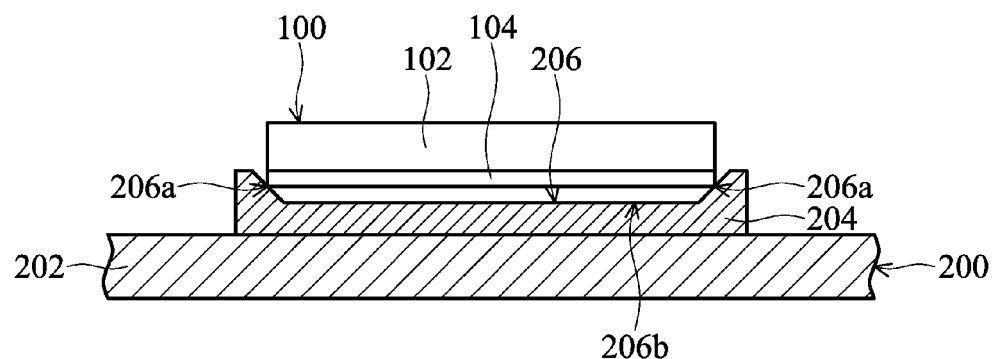

As shown in FIG. 5B, the support 204 on the tray component 202 has a trench recess 206 formed thereon along the direction of the cross section line 5-5' of FIG. 2B. The trench recess 206 has two sidewalls 206a and a bottom side 206b, wherein the two sidewalls 206a are formed along the same direction as the direction of the cross section line 3-3' of FIG. 2B and the two sidewalls 206a are inclined to the bottom side 206b. The window 104 of the chip package 100 is placed in the trench recess 206 of the support 204. Note that the inclined sidewalls 206a of the trench recess 206 can help the window 104 of the chip package 100 to be easily placed in the trench recess 206 of the support 204. Moreover, the inclined sidewalls 206a of the trench recess 206 can clamp onto the window 104 of the chip package 100 and help to fix the chip package 100 in the carrier 200.

Figure 5C:
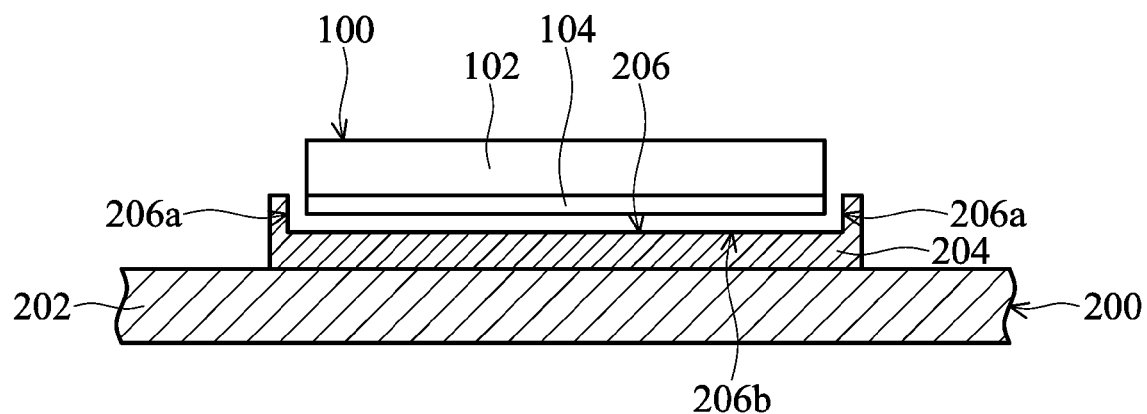

As shown in FIG. 5C, the support 204 on the tray component 202 has a trench recess 206 formed thereon along the direction of the cross section line 5-5' of FIG. 2B. The trench recess 206 has two sidewalls 206a and a bottom side 206b, wherein the two sidewalls 206a are formed along the same direction as the direction of the cross section line 3-3' of FIG. 2B and the two sidewalls 206a are vertical to the bottom side 206b. The window 104 of the chip package 100 is placed in the trench recess 206 of the support 204.

Figure 5D:
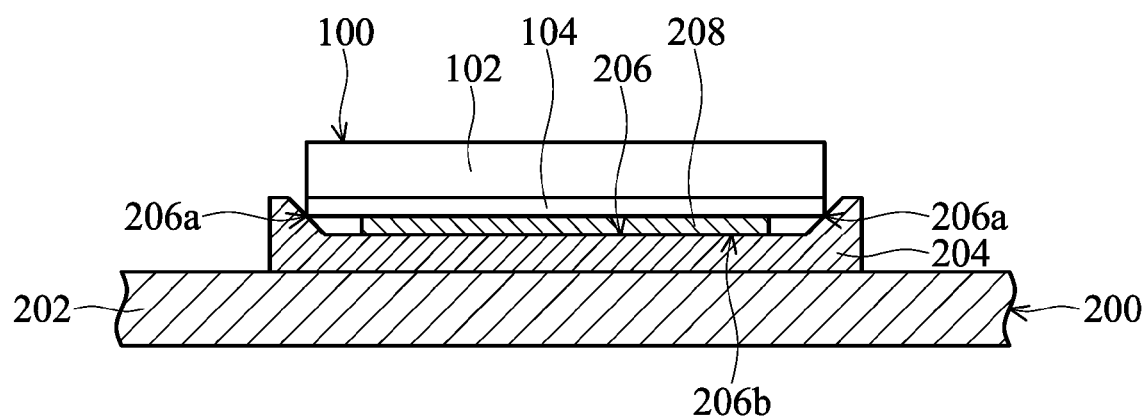

As shown in FIG. 5D, the support 204 on the tray component 202 has a trench recess 206 formed thereon along the direction of the cross section line 5-5' of FIG. 2B. The trench recess 206 has two sidewalls 206a and a bottom side 206b, wherein the two sidewalls 206a are formed along the same direction as the direction of the cross section line 3-3' of FIG. 2B and the two sidewalls 206a are inclined to the bottom side 206b. The window 104 of the chip package 100 is placed in the trench recess 206 of the support 204. The inclined sidewalls 206a of the trench recess 206 can help the window 104 of the chip package 100 to be easily placed in the trench recess 206 of the support 204. Moreover, the inclined sidewalls 206a of the trench recess 206 can clamp onto the window 104 of the chip package 100 and help to fix the chip package 100 in the carrier 200. Furthermore, in the embodiment, at least one projection 208 is formed in the trench recess 206. The projection 208 can help the support 204 of the carrier 200 to support the chip package 100.

Note that the chip package 100 may a chip package without a window formed thereon and the two inclined sidewalls 206a as shown in the embodiments of the carriers 200 of FIGS. 5B and 5D can be used to clamp the two sides of the chip package for holding the chip packages in the carrier 200.

Figure 3D:
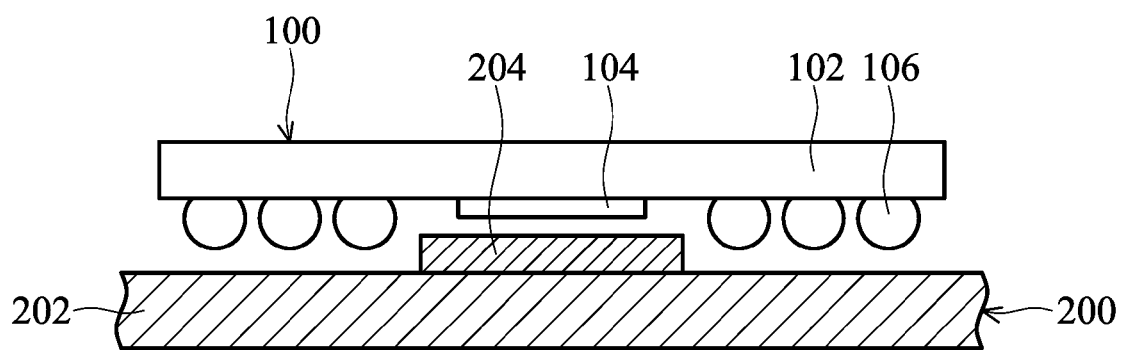

As shown in FIG. 3D, in an embodiment, the support 204 on the tray component 202 along the direction of the cross section line 3-3' of FIG. 2B has no sidewall formed thereon. Therefore, corresponding with the embodiment of the carrier 200 as shown in FIG. 3D, a cross section of the embodiment of the carrier 200 along the cross section line 5-5' of FIG. 2B may be the embodiment of the carrier 200 as shown in FIG. 5B or FIG. 5D.

Figure 2C:
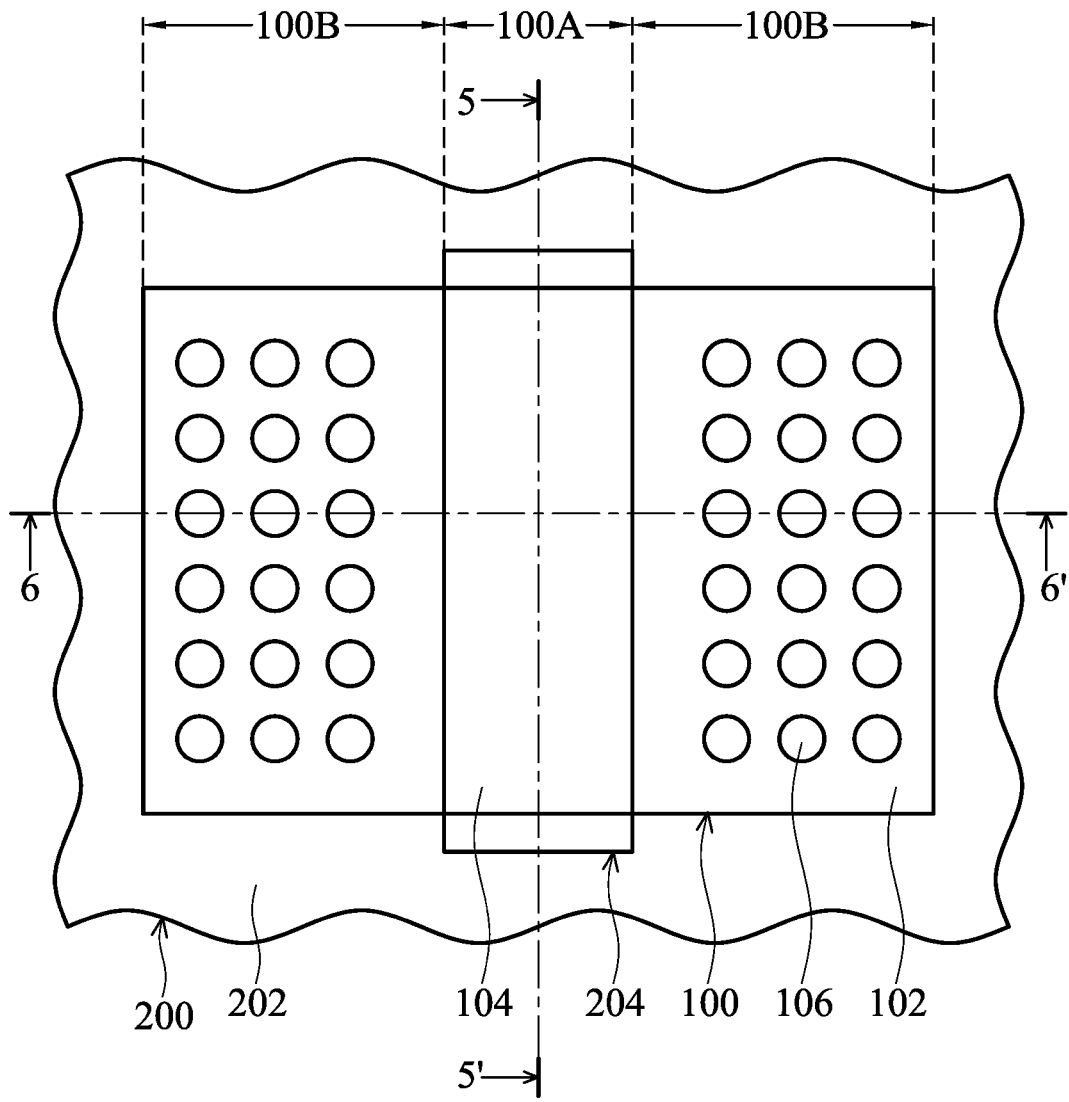
FIG. 2C shows an illustrative plane view of a chip package held by a carrier according to an embodiment of the invention.

Then, referring to FIG. 2C, an illustrative plane view of the chip package 100 in a carrier 200 according to an embodiment of the invention is shown. In an embodiment, the chip package 100 may be a wBGA type chip package. The wBGA type chip package 100 has a central area 100A without solder balls and a peripheral area 100B with solder balls 106 thereon. In addition, a window 104 is formed on the central area 100A of the chip package 100. A carrier 200 is disposed under the chip package 100 for holding the chip package 100. The carrier 200 has a tray component 202 and a plurality of supports 204 formed on the tray component 202. The supports 204 project from the tray component 202 and each support 204 holds the central area 100A of a respective chip package 100.

Figure 6:
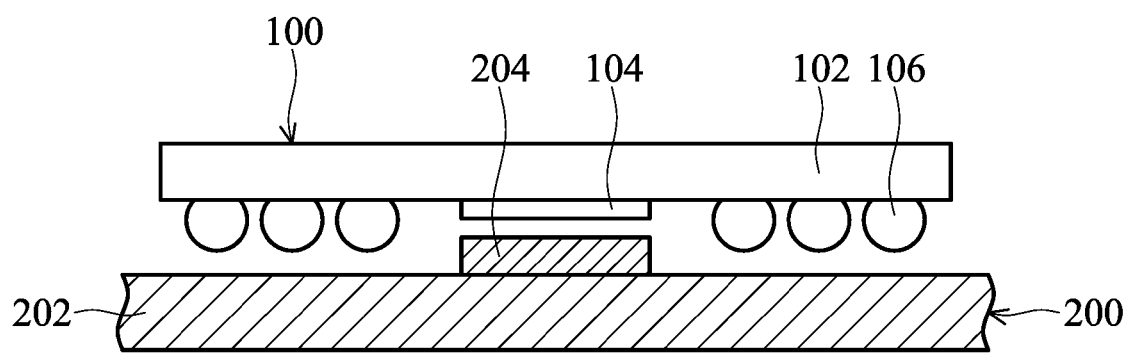
FIG. 6 shows an illustrative cross section of a chip package held by a carrier along a cross section line 6-6' of FIG. 2C according to an embodiment of the invention.

Next, referring to FIG. 6, an illustrative cross section of the chip package 100 held by the carrier 200 along a cross section line 6-6' of FIG. 2C according to an embodiment of the invention is shown. As shown in FIG. 6, the support 204 on the tray component 202 has no trench recess formed thereon along the direction of the cross section line 6-6' of FIG. 2C. Therefore, corresponding with the embodiment of the carrier 200 as shown in FIG. 6, a cross section of the embodiment of the carrier 200 along the cross section line 5-5' of FIG. 2C may be the embodiment of the carrier 200 of FIG. 5B or FIG. 5D. Note that, for a chip package without a window formed thereon, the two inclined sidewalls 206a as shown in the embodiments of the carriers 200 of FIGS. 5B and 5D can be used to clamp two sides of the chip package for holding the chip packages in the carrier 200.

Figure 7:
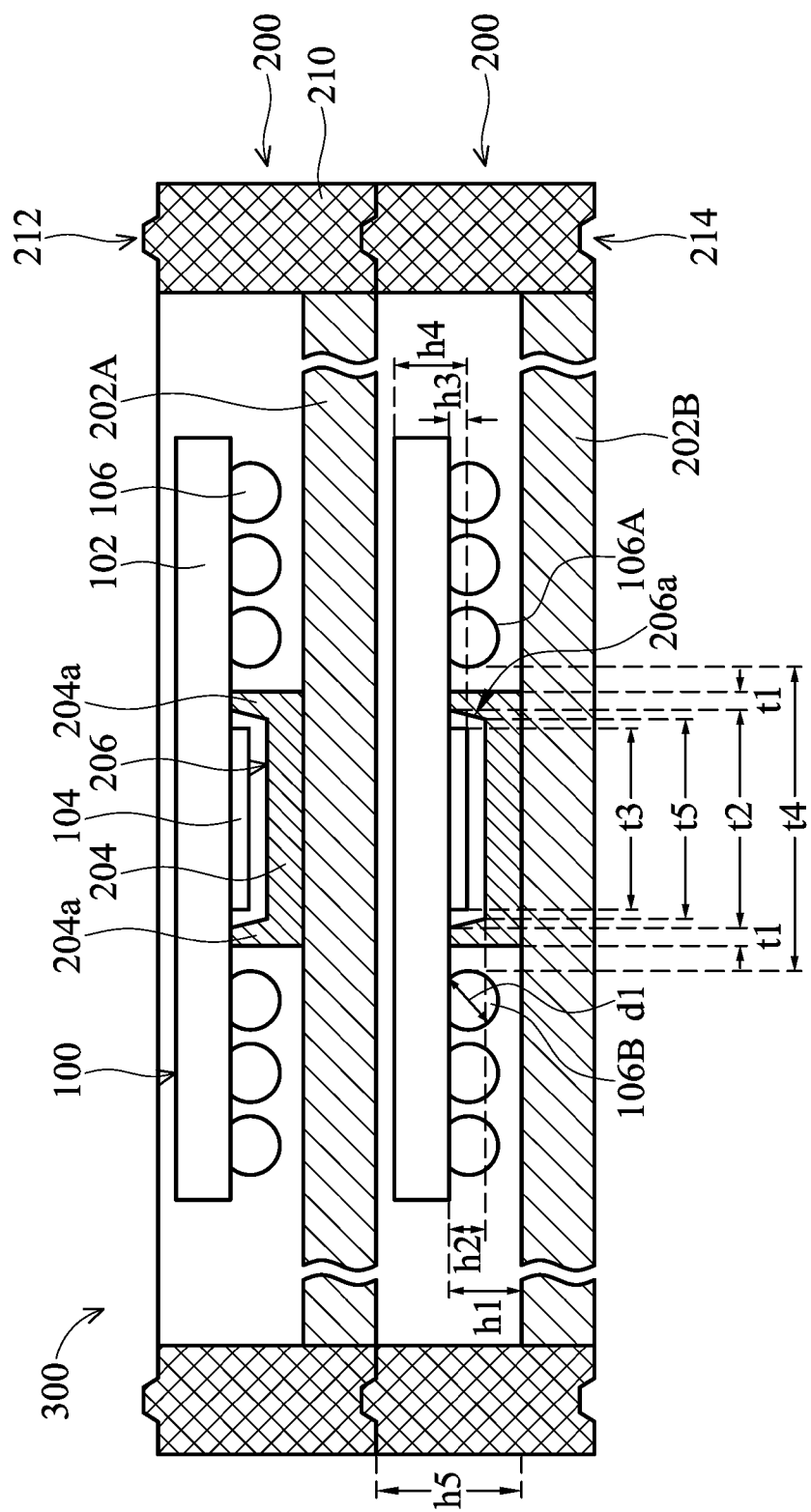
FIG. 7 shows an illustrative cross section of chip packages held by a carrier assembly according to an embodiment of the invention.

Next, referring to FIG. 7, an illustrative cross section of chip packages 100 held by a carrier assembly 300 according to an embodiment of the invention is shown. The carrier assembly 300 is formed by stacking a plurality of carriers 200 together, wherein each carrier 200 can be any one of the embodiments of the carriers 200 as mentioned above. In an embodiment of the carrier assembly 300, a plurality of peripheral projections 210 is formed at a periphery of each tray component 202. Each peripheral projection 210 has a pin 212 formed on a top of the peripheral projection 210 and a hole 214 formed on a bottom of the peripheral projection 210. When the carriers 200 are stacked to form the carrier assembly 300, the pins 212 of the peripheral projections 210 of a lower tray component 202B are put in the holes 214 of the peripheral projections 210 of an upper tray component 202A.

In an embodiment of the invention, the dimensions of the chip package 100 and the dimensions of the carrier 200, including the peripheral projections 210 disposed at the periphery of the tray component 202, can be defined to make the chip packages 100 placed in the carrier 200 during transporting and processing of the chip packages 100 during manufacturing and testing operations, and prevent the chip packages 100 from damage when the carrier 200 is moved.

As shown in FIG. 7, a height from a bottom of the chip package 100 to a top surface of the window 104 facing the trench recess 206 is defined by h4, wherein the bottom of the chip package 100 is a surface which has no solder balls formed thereon. A height of the window 104 is defined by h3. A width of the window 104 along the direction of the cross section line 3-3' of FIGS. 2A and 2B or along the direction of the cross section line 6-6' of FIG. 2C is defined by t3. A diameter of each solder ball 106 is defined by d1. A minimum distance from a solder ball 106A adjacent to a right side of the window 104 to a solder ball 106B adjacent to a left side of the window 104 is defined by t4. A height of the support 204 is defined by h1. A depth of the trench recess 206 is defined by h2. A top width of a wall 204a of the support 204 is defined by t1. A top width of the trench recess 206 along the direction of the cross section line 3-3' of FIGS. 2A and 2B or along the direction of the cross section line 6-6' of FIG. 2C, near the chip package 100, is defined by t2. A bottom width of the trench recess 206 along the direction of the cross section line 3-3' of FIGS. 2A and 2B or along the direction of the cross section line 6-6' of FIG. 2C, near the tray component 202, is defined by t5. A height from a top surface of the tray component 202 to a top of the peripheral projection 210, not including the height of the pin 212, is defined by h5, wherein the top surface of the tray component 202 has the support 204 formed thereon.

Then, according to the dimensions of the chip package 100 and the dimensions of the carrier 200 defined as mentioned above, in the preferred embodiments of the invention, five conditions listed as below need to be satisfied:

1. $t1=(t4-t3)/4$;
2. $t2>t3$, and $t2<(t4-3t1)$, and $t5>t3$;
3. $h1>d1$;
4. $h2>h3$; and
5. $h5>(h4+h1)$.

When condition 1, is satisfied, it can prevent the support 204 on the tray component 202 from contacting with the solder balls 106 of the chip package 100. Furthermore, condition 1, defines the top width t1 of the wall 204a of the support 204. When condition 2 and condition 4, are satisfied, the window 104 of the chip package 100 is placed in the trench recess 206 of the support 204 on the tray component 202. When condition 3, is satisfied, the solder balls 106 of the chip package 100 are spaced apart from the tray component 202 and not in contact with the tray component 202 to prevent the solder balls 106 from pressing up against the tray component 202. When condition 5, is satisfied, it can prevent the upper carrier 200 from pressing up against the chip package 100 placed in the lower carrier 200. Furthermore, condition 5, defines the depth h5 dimension of the carrier 200.

According to the embodiments of the invention, the chip packages 100 are held by the supports 204 on the tray component 202 of the carrier 200, wherein the central area 100A of each chip package 10 is placed in the trench recess 206 of a respective one of the supports 204 on the tray component 202. Therefore, the chip packages 100 are securely held by the carrier 200 during transporting and processing of the chip packages 100 during manufacturing and testing operations, and are prevented from damage during when the carrier 200 is moved. Moreover, because the central area 100A of the chip packages 100 are held by the support 204 of the carrier 200, the space between the outside solder balls 106 and the outside of the chip 102 can be reduced to satisfy the requirement for increasing the amount of solder balls for chip packages for new generation electronic products.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A carrier for holding a plurality of chip packages, wherein the chip package has a central area without solder balls and a peripheral area with solder balls formed thereon, comprising:
   a tray component; and
   a plurality of supports disposed on the tray component, wherein each support holds the central area of a respective chip package and each support has a trench recess thereon corresponding to the central area of the chip package, wherein the trench recess has at least two sidewalls along the same direction and a bottom side, the two sidewalls are inclined to the bottom side, and the sides of the chip package are clamped by the two inclined sidewalls of the trench recess.

2. The carrier as claimed in claim 1, wherein the plurality of supports project from the tray component.

3. The carrier as claimed in claim 2, wherein the chip package comprises a window ball grid array (wBGA) type chip package, having a window formed on the central area of the chip package, and the window is placed in the trench recess.

4. The carrier as claimed in claim 2, wherein the trench recess has two sidewalls along a first direction, two sidewalls along a second direction perpendicular to the first direction, and the bottom side, the two sidewalls along the first direction are inclined to the bottom side and the two sidewalls along the second direction are vertical or inclined to the bottom side.

5. The carrier as claimed in claim 2, wherein each support further comprises at least one projection formed in the trench recess.

6. The carrier as claimed in claim 1, further comprising a plurality of peripheral projections disposed at a periphery of the tray component.

7. The carrier as claimed in claim 6, wherein each peripheral projection has a pin formed on a top of the peripheral projection and a hole formed on a bottom of the peripheral projection.

8. A carrier for holding a plurality of chip packages, wherein the chip package has a central area without solder balls and a peripheral area with solder balls formed thereon, and a window is formed on the central area of the chip package, comprising:
   a tray component;
   a plurality of peripheral projections disposed at a periphery of the tray component; and
   a plurality of supports disposed on the tray component, wherein each support holds the central area of a respective chip package and has a trench recess formed thereon corresponding to the central area of the chip packages, and the trench recess has at least two inclined sidewalls and a bottom side and the sides of the chip package are clamped by the two inclined sidewalls of the trench recess.

9. The carrier as claimed in claim 8, wherein the window of the chip package is placed in the trench recess of the support.

10. The carrier as claimed in claim 8, wherein the chip packages are held by the carrier through the supports.

11. The carrier as claimed in claim 8, wherein the solder balls of the chip packages are not in contact with the tray component.

12. A carrier assembly for holding a plurality of chip packages, comprising;
    a plurality of the carriers claimed in claim 1; and
    a plurality of peripheral projections disposed at a periphery of each tray component, wherein each peripheral projection has a pin formed on a top of the peripheral projection and a hole formed on a bottom of the peripheral projection,
    wherein the carriers are stacked together by putting the pins of the peripheral projections of a lower tray component in the holes of the peripheral projections of an upper tray component.

13. The carrier assembly as claimed in claim 12, wherein the plurality of supports project from the tray component and each support has the trench recess thereon, facing the central area of the chip package.

14. The carrier assembly as claimed in claim 13, wherein the chip package comprises a window ball grid array (wBGA) type chip package, having a window formed on the central area of the chip package, and the window is placed in the trench recess.

15. The carrier assembly as claimed in claim 13, wherein the trench recess has two sidewalls along a first direction, two sidewalls along a second direction perpendicular to the first direction, and the bottom side, and the two sidewalls along the first direction are inclined to the bottom side and the two sidewalls along the second direction are vertical or inclined to the bottom side.

16. The carrier assembly as claimed in claim 13, wherein each support further comprises at least one projection formed in the trench recess.

17. The carrier assembly as claimed in claim 12, wherein the chip packages are held by the supports.

18. The carrier assembly as claimed in claim 12, wherein the solder balls of the chip packages are not in contact with the tray components.

* * * * *